(12) United States Patent
Son et al.

(10) Patent No.: US 10,540,458 B2
(45) Date of Patent: Jan. 21, 2020

(54) SYSTEM AND METHOD FOR MONITORING PHOTOVOLTAIC POWER GENERATION

(71) Applicant: Sejong Industry-Academia Cooperation Foundation Hongik University, Sejong-si (KR)

(72) Inventors: Hyun Seung Son, Dangjin-si (KR); Bo Kyung Park, Seoul (KR); Woo Sung Jang, Yangju-si (KR); Robert Young Chul Kim, Yongin-si (KR)

(73) Assignee: SEJONG INDUSTRY-ACADEMIA COOPERATION FOUNDATION HONGIK UNIVERSITY, Sejong-si (KR)

( * ) Notice: Subject to any disclaimer, the term of this patent is extended or adjusted under 35 U.S.C. 154(b) by 584 days.

(21) Appl. No.: 15/297,268

(22) Filed: Oct. 19, 2016

(65) Prior Publication Data
US 2017/0308628 A1 Oct. 26, 2017

(30) Foreign Application Priority Data

Apr. 26, 2016 (KR) ........................ 10-2016-0051025

(51) Int. Cl.
*G06F 17/50* (2006.01)
*H02S 50/00* (2014.01)
*G05F 1/66* (2006.01)

(52) U.S. Cl.
CPC .......... *G06F 17/5009* (2013.01); *H02S 50/00* (2013.01); *G05F 1/66* (2013.01)

(58) Field of Classification Search
CPC ........ H02J 3/383; H02J 3/381; G01R 21/133; H04L 12/403; G05B 15/02; G05B 23/027; G06Q 10/101; G06Q 40/04; G06Q 50/06
See application file for complete search history.

(56) References Cited

U.S. PATENT DOCUMENTS

| 10,121,120 B2* | 11/2018 | Deguchi ................. G06Q 50/06 |
| 2005/0007249 A1* | 1/2005 | Eryurek ............... G05B 23/027 340/511 |

(Continued)

FOREIGN PATENT DOCUMENTS

KR          10-1415163          7/2014

OTHER PUBLICATIONS

Bo kyung Park et al., "Best Practice on Cost Estimation and Priority with Use Case Point (UCP) for Renewable Energy System"; Advanced and Applied Convergence Letters AACL 07; Advanced and Applied Convergence, 2nd International Joint Conference, IJCC 2016, Jan. 18-22, 2016, pp. 23-26.

(Continued)

*Primary Examiner* — Kandasamy Thangavelu
(74) *Attorney, Agent, or Firm* — Kile Park Reed & Houtteman PLLC

(57) ABSTRACT

Disclosed are a system and method for monitoring photovoltaic power generation, which may enhance compatibility with the existing legacy system by enabling data integration between monitoring systems that use different kinds of protocols on the basis of a meta-model and may automatically generate code for processing data and automatically generate a program for processing a protocol through the generated code, thus allowing even a user who does not know the protocol well to easily connect devices.

5 Claims, 18 Drawing Sheets

(56) References Cited

U.S. PATENT DOCUMENTS

| | | | | |
|---|---|---|---|---|
| 2013/0024034 A1* | 1/2013 | Iino | ......................... | H02J 3/383 |
| | | | | 700/291 |
| 2014/0278163 A1* | 9/2014 | Tan | ...................... | G01R 21/133 |
| | | | | 702/60 |
| 2014/0310243 A1* | 10/2014 | McGee | ................. | G06Q 10/101 |
| | | | | 707/639 |
| 2015/0094968 A1* | 4/2015 | Jia | .......................... | G06Q 40/04 |
| | | | | 702/60 |
| 2016/0161965 A1* | 6/2016 | Nawy | ..................... | G05B 15/02 |
| | | | | 700/291 |
| 2016/0254929 A1* | 9/2016 | Thiel | ..................... | H04L 12/403 |
| | | | | 370/329 |
| 2017/0005515 A1* | 1/2017 | Sanders | .................. | H02J 3/381 |

OTHER PUBLICATIONS

Hyun Seung Son et al., "Modeling a Photovoltaic Monitoring System based on Maintenance Perspective for New and Renewable Energy"; Advanced and Applied Convergence Letters AACL 07; Advanced and Applied Convergence, 2nd International Joint Conference, IJCC 2016, Jan. 18-22, 2016, pp. 144-147.

* cited by examiner

FIG. 9

| Name | Notation | Attributes | Comments |
|---|---|---|---|
| Protocol Model | Protocol Model Name=SensorProtocol | name | top model, which has general name of model |
| Send Packet | SendPacket | - | transmission packet |
| Recv Packet | RecvPacket | - | reception packet |
| START | START{1} Token=# Token Type=STRING | size, token, token type | beginning of protocol |
| COMMAND | COMMAND{9} Token=1NQ110000 Token Type=STRING | size, token, token type | instruction information |
| HEADER | HEADER {1} Name=CR Data Type=STRING | size, name, data type | header information |
| DATA | DATA{4} Name=temp Data Type=HEX | size, name, data type | data information |
| PARITY BIT | PARITY BIT{2} Index=1-17 Data Type=HEX Function Type = SUM | size, beginning and end of index, data type, function type | parity bit information |
| END | END{1} Token=$ Token Type=STRING | size, token, token type | end of protocol |

FIG. 11

```xml
<?xml version="1.0" encoding="UTF-8"?>
<protocolModel:ProtocolModel                xmi:version="2.0"
xmlns:xmi="http://www.omg.org/XMI"
xmlns:xsi="http://www.w3.org/2001/XMLSchema-instance"
xmlns:protocolModel="http://www.example.org/protocolModel" name="SensorProtocol">
  <sendpacket>
    <sendtype xsi:type="protocolModel:Start" size="1" token="#"/>
    <sendtype xsi:type="protocolModel:Command" size="9" token="1NQ110000"/>
    <sendtype xsi:type="protocolModel:End" size="1" token="$"/>
  </sendpacket>
  <recvpacket>
   <recvtype xsi:type="protocol Model:Start" size="1" token="#"/>
   <recvtype xsi:type="protocol Model:Header" size="1" name="ST" dataType="STRING DECIMAL"/>
   <recvtype xsi:type="protocol Model:Header" size="1" name="ID" dataType="STRING" />
   <recvtype xsi:type="protocol Model:Header" size="1" name="CR" dataType="STRING"/>
   <recvtype xsi:type="protocolModel:Header" size="1" name="SB" dataType="STRING DECIMAL"/>
   <recvtype xsi:type="protocolModel:Header" size="1" name="Command" dataType="STRING"/>
   <recvtype xsi:type="protocolModel:Data" size="4" name="horiz_solar_radiation" dataType="STRING_HEX"/>
   <recvtype xsi:type="protocol Model:Data" size="4" name="slant_soloar radiation" dataType="STRING_HEX"/>
   <recvtype xsi:type="protocol Model:Data" size="4" name="module_temp" dataType="STRING_HEX"/>
   <recvtype xsi:type="protocol Model:Data" size="4" name="ambient_temp" dataType="STRING_HEX"/>
   <recvtype xsi:type="protocolModel:Data" size="4" name="gyro x" dataType="STRING HEX"/>
   <recvtype xsi:type="protocolModel:Data" size="4" name="gyro_y" dataType="STRING_HEX"/>
   <recvtype xsi:type="protocol Model:Data" size="4" name="gyro_z" dataType="STRING_HEX"/>
   <recvtype xsi:type="protocolModel:Data" size="4" name="co2" dataType="STRING_HEX"/>
    <recvtype xsi:type="protocol Model:End" size="1" token="$"/>
  </recvpacket>
</protocolModel:ProtocolModel>
```

FIG. 13

```
public byte[] send()
{
  ArrayList<Byte> datas = new ArrayList<Byte>();
  Util. Add ByteArray(datas, protocolData.getSEND_START();
  Util. Add ByteArray(datas, protocolData.getSEND_COMMAN());
  Util. Add ByteArray(datas, protocolData.getSEND_END());
  Util. AddByteArray(datas, Util. ByteToString(Util.getParityBit(datas, 1, 17)));
  byte[] out = Util. ArrayList ToByteArray(datas);
  return out;
}
```

FIG. 15

```
protected boolean recv(byte[] readData)
{
        int _index = 0;
        if(readData[_index] != protocolData.getRECV_START())
            return false;
        _index++;

protocolData.setNum(Util.ByteStringHexToInt(readData, _index, 2));
        _index+=2;

protocolData.setCommand(Util.ByteToString(readData[_index]));
        _index++;

protocolData.setPv_error(Util.ByteStringHexToInt(readData, _index, 4));
        _index+=4;

if(readData[_index] != protocolData.getRECV_ENDO)
                    return false;
        _index++;
        if(!Util.ByteArrayComp(readData, _index, 2, Util.StringToByte(
                          Util.ByteToString(Util.getParityBit(readData, 1, 23)), 2)))
              return false;
        return true;
}
```

FIG. 16

```
public class <model name>Data {
        private final int RECV_START = 6;
        private int num = 0;
        private String command = "";
        private int pv_error = 0;
        private final int RECV_END = 3;

public int getNum() {
                return num;
        }
        public void setNum(int num) {
                this.num = num;
        }
        public String getCommand() {
                return command;
        }
        public void setCommand(String command) {
                this.command = command;
        }
        public int getPv_error() {
                return pv_error;
        }
        public void setPv_error(int pv_error) {
                this.pv_error = pv_error;
        }
        public byte getRECV_START() {
                return RECV_START;
        }
        public byte getRECV_END() {
                return RECV_END;
        }
}
```

FIG. 17

| type | size | Util API |
|---|---|---|
| HEX, DECIMAL | - | - |
| STRING_BINARY | 1 | int ByteStringBinaryToInt(byte b) |
| | n | int ByteStringBinaryToInt(byte[] b, int start, int end) |
| STRING_OCTAL | 1 | int ByteStringOctalToInt(byte b) |
| | n | int ByteStringOctalToInt(byte[] b, int start, int end) |
| STRING_DECIMAL | 1 | int ByteStringDecimalToInt(byte b) |
| | n | int Byte StringDecimalToint(byte[] b, int start, int end) |
| STRING_HEX | 1 | int ByteStringHexToint(byte b) |
| | n | int ByteStringHexToInt(byte[] b, int start, int end) |
| STRING | 1 | String ByteToString(byte b) |
| | n | String ByteToString(byte[] b, int start, int end) |

FIG. 18

| | | | |
|---|---|---|---|
| API | byte getParityBit(ArrayList<Byte> bytes, int start, int end) | API | int ByteString BinaryToInt(byte b) |
| Comment | Add from start value to end value in ArrayList and return byte | Comment | Convert into int value and return when there is byte value but actual data is binary string |
| API | byte getParityBit(byte[] byteList, int start, int end) | API | int Byte String BinaryToInt(byte[] b; int start, int end) |
| Comment | Add from start value to end value in byte array and return byte | Comment | Convert start value and end value into int values when there is byte array value but actual data is binary string |
| API | byte[] ArrayListToByteArray(ArrayList<Byte> byteList) | API | int ByteStringOctalToInt(byte b) |
| Comment | Convert ArrayList into byte array and return | Comment | Convert into int value and return when there is byte value but actual data is octal string |
| API | ArrayList<Byte> ByteArrayToArrayList(byte[] byteList) | API | int ByteStringOctal ToInt(byte[] b; int start, int end) |
| Comment | Convert byte array into ArrayList and return | Comment | Convert start value and end value into int values when there is byte array value but actual data is octal string |
| API | void AddByteArray(ArrayList<Byte> bytes, String input) | API | int ByteStringDecimalToInt(byte b) |
| Comment | Convert String value into byte and add to ArrayList | Comment | Convert into int value and return when there is byte value but actual data is decimal string |
| API | void AddByteArray(ArrayList<Byte> bytes, byte input) | API | int ByteString DecimalToInt(byte[] b, int start, int end ) |
| Comment | Add byte value to ArrayList | Comment | Convert start value and end value into int values when there is byte array value but actual data is decimal string |
| API | byte StringToByte(String data) | API | int ByteStringHexToInt(byte b) |
| Comment | Convert String data into byte value | Comment | Convert into int value and return when there is byte value but actual data is hexadecimal string |
| API | byte1 StringToByte(String data, int size) | API | int ByteString HexToInt(byte[] b, int start, int end) |
| Comment | Receive String data and return in byte array by size value | Comment | Convert start value and end value into int values when there is byte array value but actual data is hexadecimal string |
| API | String ByteToString(byte b) | API | boolean ByteArrayComp(byte[] readData, int index, int i, byte[] stringToByte |
| Comment | Receive byte value, convert into String, and return | Comment | Compare two byte values, and return true when equal and return false when not equal |
| API | String ByteToString(byte[] b, int start, int end) | | |
| Comment | Receive byte array value and return byte values from start value to end value as String | | |

SYSTEM AND METHOD FOR MONITORING PHOTOVOLTAIC POWER GENERATION

CROSS-REFERENCE TO RELATED APPLICATION

This application claims priority to and the benefit of Korean Patent Application No. 2016-0051025, filed on 26, Apr., 2016, the disclosure of which is incorporated herein by reference in its entirety.

BACKGROUND

1. Field of the Invention

The present invention relates to a system and method for monitoring photovoltaic power generation, and more particularly, to a system and method for monitoring photovoltaic power generation that integrate data based on a meta-model to enable servers with different types of communication protocols to be compatible with one another.

2. Discussion of Related Art

In recent years, there has been increased interest in new renewable energy because the world faces the problem of energy depletion due to continuous increase in world population, instability in oil price, and limited resources.

New renewable energy collectively refers to new energy such as fuel cells, hydrogen, liquefied coal, and gas and renewable energy such as sunlight, solar heat, bio energy, wind power, water power, ocean energy, and geothermal heat. In particular, the new renewable energy refers to energy obtained by converting existing fossil fuels or converting renewable energy including sunlight, water, geothermal heat, precipitation, and biological organisms.

Of the new renewable energy, in particular, photovoltaic power generation has been attracting attention because a photovoltaic module has high efficiency due to an advance in the photovoltaic energy technology and becomes economically feasible due to a reduction in the prices of photovoltaic modules.

However, photovoltaic power generation may have a risk of fire because energy is stored as electricity and also may cause casualties when large-sized structures needed for the photovoltaic power generation are damaged due to natural disasters.

Also, photovoltaic power generation needs continuous management to achieve an efficient power generation rate because the amount of power generation changes rapidly due to the change in weather, such as the amount of sunlight. In South Korea, an integrated monitoring system for enhancing the amount of energy production, the current operation state, a utilization rate of photovoltaic facilities, etc. is provided as mandatory service. However, power generation facilities at the level of eup, myeon, and dong, which are administrative units in South Korea, are frequently not managed. Also, facilities associated with photovoltaic energy may become neglected because they cannot be operated after the maintenance period ends or can no longer receive technical support and maintenance when a development company or a construction company goes broke or withdraws local branches.

In this way, there is active development for maintenance and management of the photovoltaic power generation system. For example, Korean Patent No. 10-1415163 (hereinafter referred to as "Patent document 1") discloses a system for monitoring photovoltaic power generation.

Patent document 1 relates to a system for monitoring photovoltaic power generation that receives power generation statuses of regionally installed photovoltaic power generation systems over a network and monitors the received statuses in real time to facilitate maintenance and includes a plurality of photovoltaic power generation units including solar cell modules configured to convert solar energy into electric energy and output the electric energy, photovoltaic power generation measurement unit installed in each of the photovoltaic power generation units, and a photovoltaic power generation monitoring unit configured to receive various types of information measured by the photovoltaic power generation measurement unit over a network and monitor the received information.

However, in the patent document 1, protocols used by the photovoltaic power generation unit and the photovoltaic power generation measurement unit may be different because the monitoring is performed over the network. In this case, a method of inter-converting or integrating heterogeneous protocols is not described in the patent document 1.

SUMMARY OF THE INVENTION

The present invention is proposed to solve the problems of the related art and may enhance compatibility with the existing legacy system by enabling data integration between monitoring systems that use different kinds of protocols on the basis of a meta-model.

According to the present invention, it is also possible to automatically generate code for processing data and automatically generate a program for processing a protocol through the generated code, thus allowing even a user who does not know the protocol well to easily connect devices.

According to an aspect of the present invention, there is provided a method of monitoring photovoltaic power generation using a plurality of photovoltaic power generation facilities installed in a regionally distributed manner and an integrated server configured to manage the plurality of photovoltaic power generation facilities in an integrated manner, the method including generating an integrated communication protocol applied to all of the plurality of photovoltaic power generation facilities and the integrated server. The generating of an integrated communication protocol includes individually modeling a communication protocol used by each of the photovoltaic power generation facilities based on a meta-model in order to provide collected data to the integrated server, generating code using the individually modeled communication protocol based on the meta-model, and mapping the generated code to an integrated meta-model designed in the integrated server.

In a meta-model-based protocol model in the protocol modeling step, a data type and a data size may be written into a block-shaped element, and elements of the modeled protocol may be in order.

The order of the elements of the modeled protocol may be from left to right, and when there are lower blocks, all of the lower blocks may be performed, and then movement to the first upper block at a right side may be achieved.

The code generating step may use a data class, a util class, and a send/receive class in order to automatically generate program code using a result of the modeling based on the meta-model, the communication protocol coded in the code generating step may be stored in the util class and configured to generate code using a code generation unit for automatically generating code corresponding to a preset rule and store the generated code in the data class, and the coding may be performed using the send/receive class in which the communication protocol is sent and received.

The send/receive class may include a send API and a receive API, the send API may obtain, from the data class, byte data to be used for a serial port when a protocol is sent, and the receive API may sequentially read and input the obtained byte data into the data class when the protocol is received.

The data class may form data in order of inputs made into the data protocol model.

The util class may include a util API that is already made, and the util API may be determined according to a type of data input to the data protocol model and may be utilized for the protocol interpretation in the code generating step.

The integrated-meta-model mapping step may include collecting the protocol data in a data class using the code generated in the code generating step and collecting data of the data class by inputting the data into data of a meta-model of the integrated server using a getter function.

The meta-model of the integrated server may include PlatDisplay, Invertes, Sensors, and JunctionBoxes.

The PlatDisplay may include a current output amount, current-day power generation information, previous-day power generation information, current-month power generation information, previous-month power generation information, and total power generation information, which show an entire monitoring result. Invertes may include current power generation, current-day power generation, previous-day power generation, total power generation, output current and voltage, input power, current, voltage, and frequency, and inverter warning information, which are obtainable by an inverter. Sersors may include horizontal solar radiation, tilted solar radiation, module temperature, external temperature, $CO_2$ concentration, and slope, which are information measured by sensors of each of the photovoltaic power generation facilities. JunctionBoxes may be used to obtain a voltage and current of the photovoltaic power generation facility.

According to another aspect of the present invention, there is provided a system for monitoring photovoltaic power generation, the system including: a plurality of photovoltaic power generation facilities installed in a regionally distributed manner, each of which includes a power generation unit and a local server; and an integrated server configured to manage the plurality of distributed photovoltaic power generation facilities in an integrated manner. In order to successfully receive data collected by the local servers of the photovoltaic power generation facilities installed in a regionally distributed manner, the integrated server individually communicates with the local servers using an integrated communication protocol generated based on a meta-model.

The power generation unit may include a solar cell module configured to receive sunlight and an additional facility configured to collect and convert energy and measurement data generated by the solar cell module, and the additional facility may include a junction box configured to access an array of the power generation unit and an inverter configured to receive data from the junction box and transmit the data to the local server.

A unique existing legacy system may be used as a protocol for monitoring internal devices corresponding to the photovoltaic power generation facilities, and the local server may monitor the junction box and the inverter of the power generation unit using the legacy system.

The integrated server may include a data collector configured to receive data from the local server, a data storage configured to store the data received by the data collector in a database, and a data analyzer configured to analyze the data of the data storage according to the integrated communication protocol.

The data analyzer may use a Hadoop-based big data system for performing a target load demand prediction service, a real-time photovoltaic energy prediction service, an integrated control service, an optimal control status and operation service, and an integrated monitoring service.

The integrated server may further include a web application accessible to the data storage from outside.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 9 is a table showing the notation that is used to form the meta-model-based protocol model.

FIG. 11 is a table showing the data storage format of the meta-model-based protocol modeling shown in FIG. 10.

FIG. 13 is a table showing an example of code generation of the send API.

FIG. 15 is a table showing an example of code generation of the recv API.

FIG. 16 is a table showing an example of data class 520.

FIG. 17 is a table showing Util API according to input data type.

FIG. 18 is a table showing a list of API of Util class.

DETAILED DESCRIPTION OF EXEMPLARY EMBODIMENTS

Figure 1:
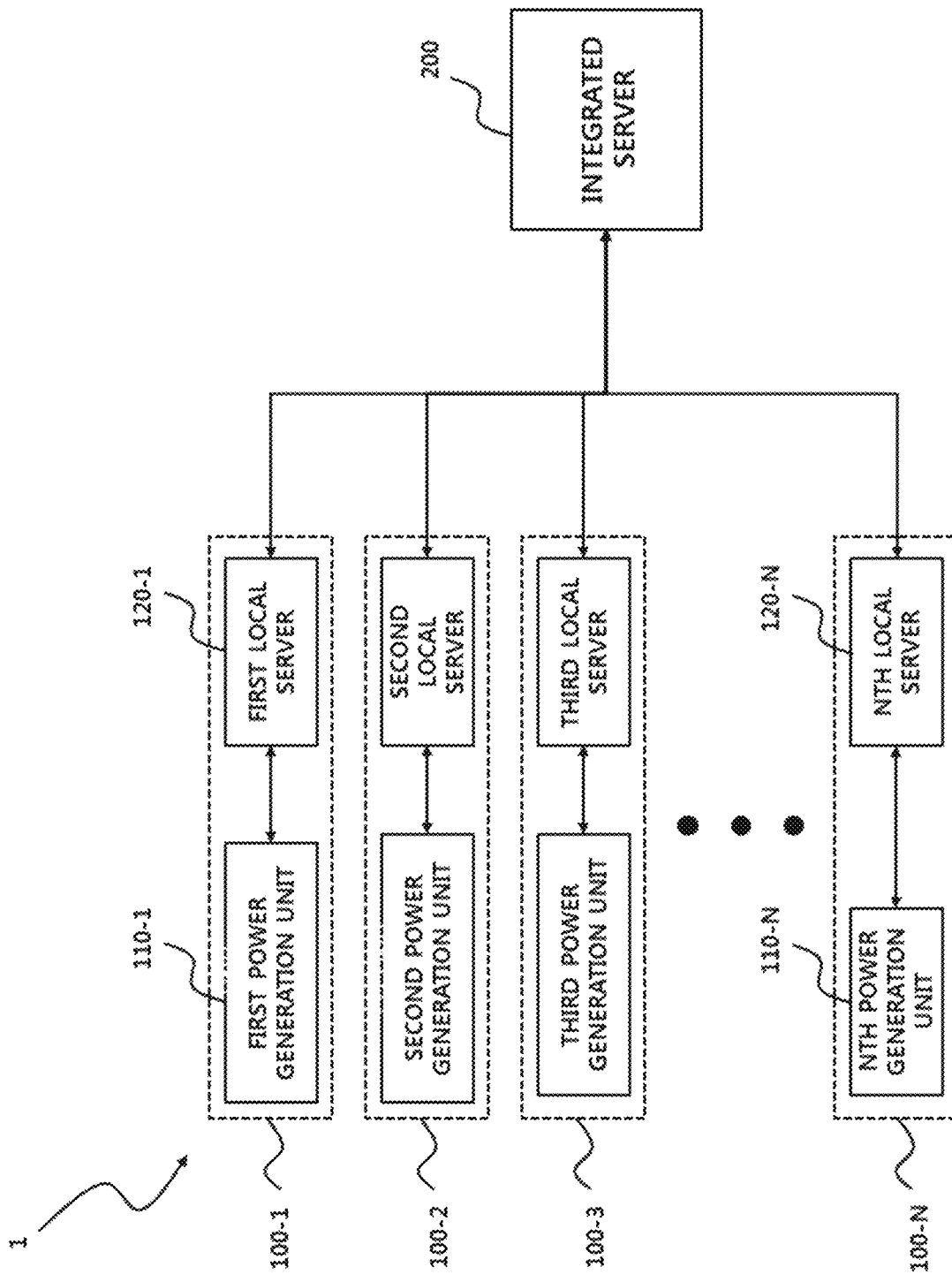
FIG. 1 is a block diagram showing a system for monitoring photovoltaic power generation according to an embodiment of the present invention.

Hereinafter, embodiments will be described in detail with reference to the accompanying drawings. However, the present invention is not restricted or limited to the embodiments. In addition, like reference numerals in the drawings denote like elements.

A system for monitoring photovoltaic power generation according to an embodiment of the present invention may monitor and manage the amount of electric power, temperature, information regarding an inclination sensor, etc., which are collected from photovoltaic cells. Since energy collected from sunlight is electrical in nature, there is a risk of fire, and also there is also a probability of casualties resulting when a structure is damaged. Thus, there is a need for management through a round-the-clock monitoring system.

Figure 2:
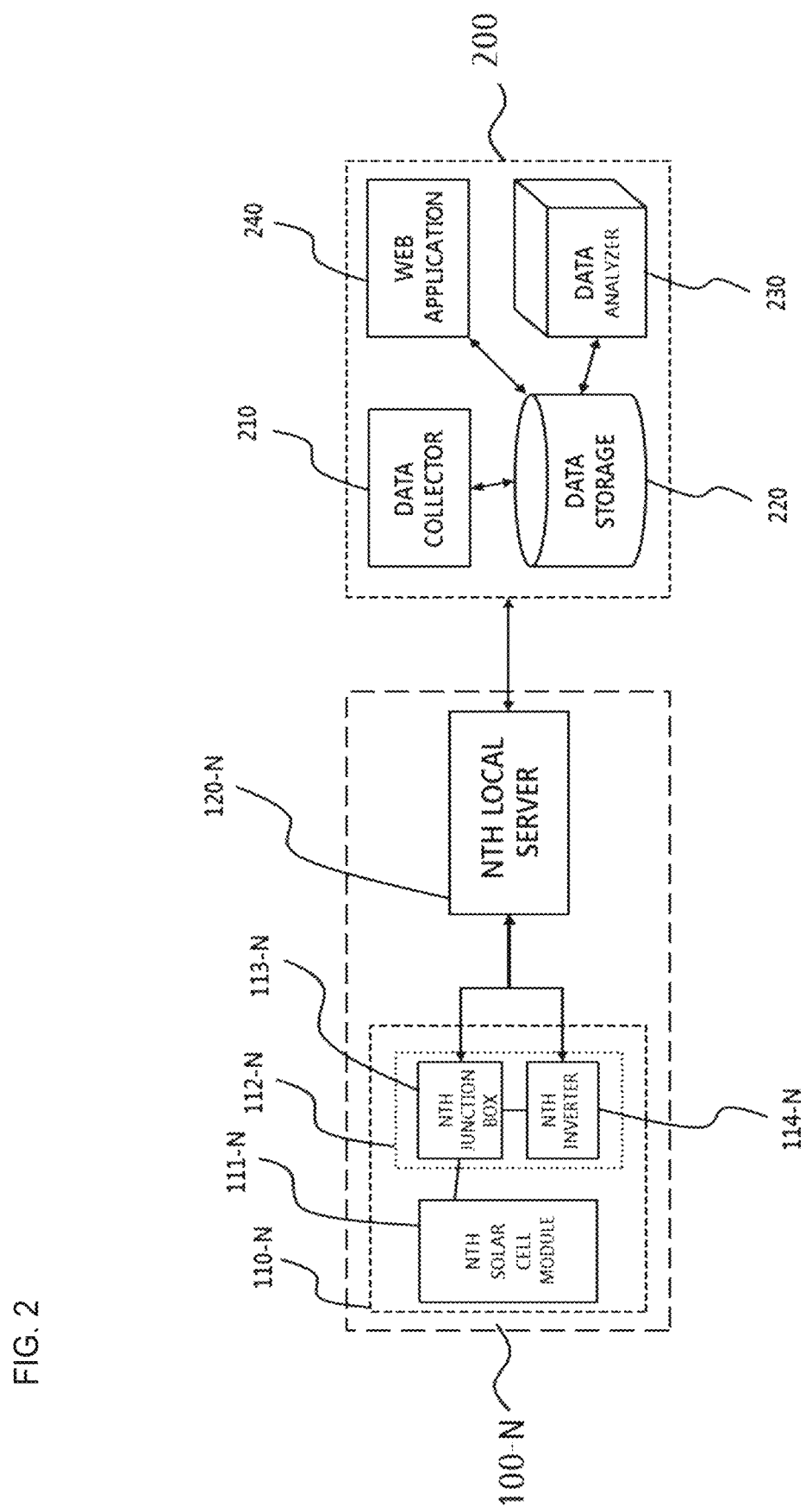
FIG. 2 is a detailed block diagram showing an Nth power generation unit and an integrated server in a system for monitoring photovoltaic power generation according to an embodiment of the present invention.

A system for monitoring photovoltaic power generation according to an embodiment of the present invention will be described below with reference to FIGS. 1 and 2. FIG. 1 is a block diagram showing a system for monitoring photovoltaic power generation according to an embodiment of the present invention, and FIG. 2 is a detailed block diagram showing an Nth power generation unit and an integrated server in a system for monitoring photovoltaic power generation according to an embodiment of the present invention.

First, referring to FIG. 1, a photovoltaic power generation monitoring system 1 includes photovoltaic power generation facilities 100-1, ..., 100-N including power generation unit 110-1, ..., 110-N and local servers 120-1, ..., 120-N and an integrated server 220 configured to manage a photovoltaic power generation state based on data collected from the photovoltaic power generation facilities 100-1, ..., 100-N.

The photovoltaic power generation facilities 100-1, ..., 100-N are installed in a regionally distributed manner. Accordingly, there is a need to manage, at a single location in an integrated manner, data measured or collected by the photovoltaic power generation facilities 100-1, ..., 100-N that are installed in a distributed manner.

The plurality of photovoltaic power generation facilities 100-1, ..., 100-N that are installed in a regionally distributed manner will be described below. The plurality of photovoltaic power generation facilities 100-1, ..., 100-N include the power generation units 110-1, ..., 110-N, and the local servers 120-1, ..., 120-N. Monitoring data collected from the power generation units 110-1, ..., 110-N is stored in databases of the local servers 120-1, ..., 120-N. In this case, since the power generation units 110-1, ..., 110-N and the local servers 120-1, ..., 120-N are located within a relatively short distance, RS232 or RS422/485 communication which is suitable for short-range communication is used.

The databases of the local servers 120-1, ..., 120-N that are regionally established integrate data of the photovoltaic power generation facilities 100-1, ..., 100-N that is transmitted to the integrated server 200 and collected from separate regions at a single location. Since the photovoltaic power generation facilities 100-1, ..., 100-N and the integrated server 200 are located at relatively long distances, TCP/IP communication may be used.

Next, the photovoltaic power generation facilities 100-1, ..., 100-N basically have the same configuration. The following description will be provided with reference to the Nth photovoltaic power generation facility 100-N and the integrated server 200 shown in FIG. 2.

First, the Nth photovoltaic power generation facility 100-N includes the Nth power generation unit 110-N and the Nth local server 120-N.

In detail, the Nth power generation unit 110-N includes an Nth solar cell module 111-N configured to directly receive sunlight and an Nth additional facility 112-N configured to collect and convert energy generated and data measured by the Nth solar cell module 111-N.

Also, the Nth additional facility 112-N includes an Nth junction box 113-N configured to connect an array of the Nth power generation unit 110-N and an Nth inverter 114-N configured to receive data from the Nth junction box 113-N and transmit the received data to the Nth local server 120-N.

In detail, the Nth inverter 114-N collects and receives analog data of the Nth solar cell module 111-N from the Nth junction box 113-N, transmits the analog data to the Nth local server 120-N, and converts direct-current (DC) electric energy generated by the Nth solar cell module 111-N into alternating current (AC) electric energy.

The Nth photovoltaic power generation facility 100-N may display, through the Nth inverter 114-N, the amount of electric power, temperature, information regarding an inclination sensor, etc. on a monitor that may be installed in the Nth local server 120-N or may transmit values measured by various types of sensors installed in the Nth solar cell module 111-N to the Nth local server 120-N.

Next, elements of the integrated server 200 will be described. The integrated server 200 includes a data collector 210 configured to receive data transmitted from the Nth local server 120-N, a data storage 220 configured to store the collected data, a data analyzer 230 configured to analyze the data stored in the data storage 220 as necessary, and a web application 240 configured to allow access to the data storage 220 from outside.

The elements of the integrated server 200 will be further described in detail below. The data collector 210 serves to collect data transmitted from the Nth local server 120-N and transmit the collected data to the data storage 220. Also, the integrated server 200 may be installed to monitor the photovoltaic power generation facilities 110-1, ..., 110-N installed in a regionally distributed manner. The data collector 210 may collect all data transmitted from the local servers 120-1, ..., 120-N.

Also, the data storage 220 collects and stores the data transmitted from the data collector 210, and the data is analyzed by the data analyzer 230. The data analyzer 230 performs the analysis using the data stored in the data collector 210 as necessary. In this case, Hadoop is used to analyze the data using a big data system.

The data analyzer 230 may perform one of a target load demand prediction service, a real-time photovoltaic energy prediction service, an integrated control service, an optimal control status and operation service, and an integrated monitoring service. In some cases, the type of service performed by the data analyzer 230 may be deleted, or the type of service to be performed by the data analyzer 230 may be added.

Also, in order to analyze and determine various types of information using the data stored in the data storage 220, the web application 240 is provided to allow a user located outside to directly access and search the data storage 220. The web application 240 may service data to be found by a user over the Internet and may store or print the found data as necessary.

In the photovoltaic power generation monitoring system 1, data should be transmitted from the local servers 120-1, ..., 120-N, which are difference types of servers installed in different regions, to the single integrated server 200. However, since the difference types of servers use different types of protocols, data transmission or reception is not smooth or even impossible. Accordingly, there is a need for a method of enabling different types of protocols to be compatible with each other.

There are two methods of enabling different types of protocols to be compatible with each other. The first method integrates communication protocols for connecting the power generation units 110-1, . . . , 110-N and the local servers 120-1, . . . , 120-N into the same type of protocol, and the second method uses the existing protocol for the photovoltaic power generation facilities 100-1, . . . , 100-N and integrates communication protocols with the integrated server 200.

The first method is inconvenient because existing apparatuses and facilities should be replaced with those using the same communication protocol. Accordingly, an embodiment of the present invention is intended to disclose an example of using the photovoltaic power generation facilities 100-1, . . . , 100-N without change and integrating communications between the local servers 120-1, . . . , 120-N and the integrated server 200, irrespective of the types of communication protocols that connect the power generation units 110-1, . . . , 110-N and the local servers 120-1, . . . , 120-N.

Figure 3:
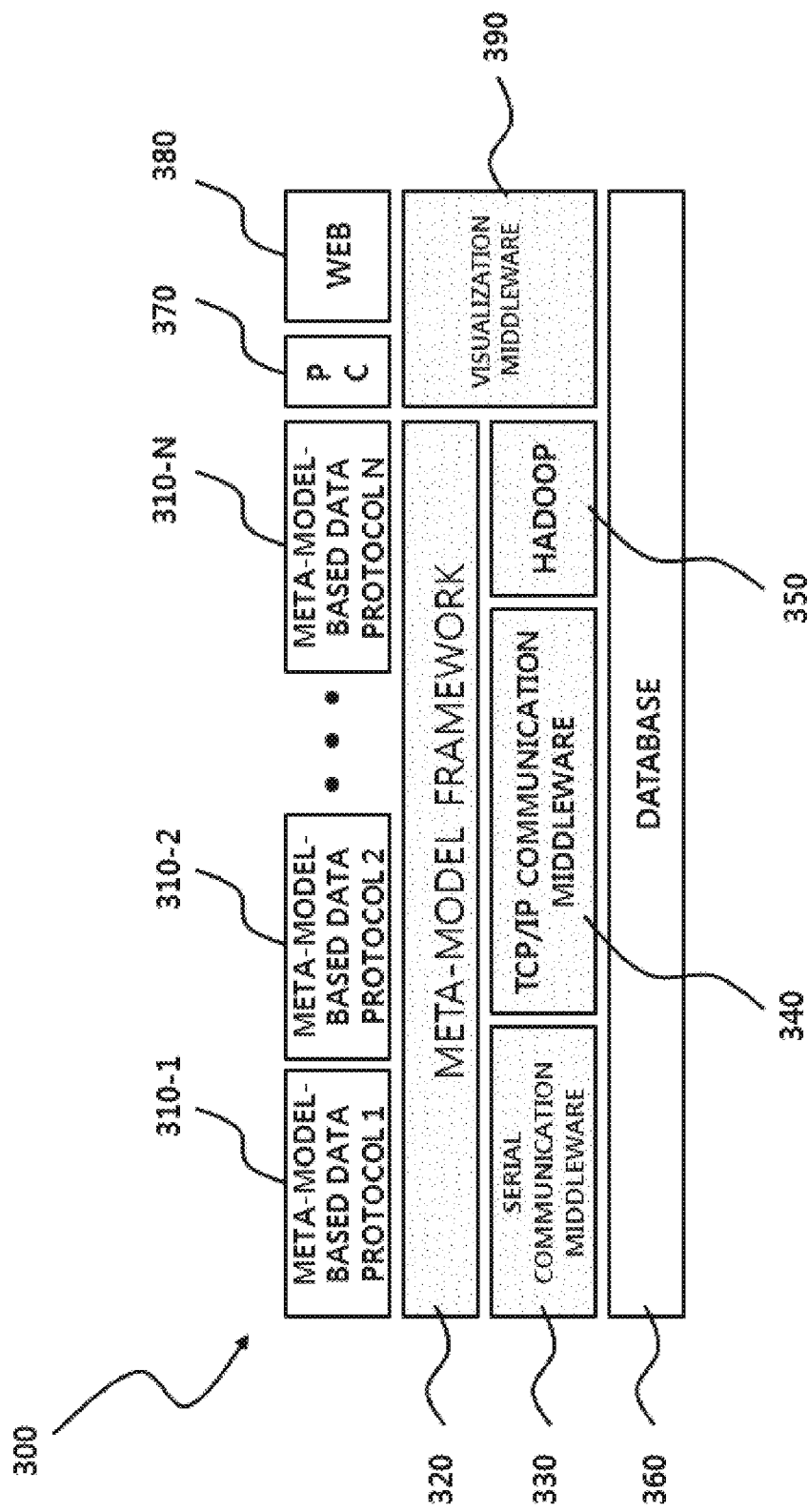
FIG. 3 is a diagram showing a structure of a software platform for a method of monitoring photovoltaic power generation according to an embodiment of the present invention.

In order to integrate the communications between the local servers 120-1, . . . , 120-N and the integrated server 200, a software platform 300 as shown in FIG. 3 should be established. The software platform 300 includes a meta-model framework 320, serial communication middleware 330, TCP/IP communication middleware 340, Hadoop 350, and visualization middleware 390.

The meta-model framework 320 is established to integrate heterogeneous data protocols 310-1, . . . , 310-N based on the meta-model. The protocol as described above integrates the serial communication middleware 330 based on the meta-model. Protocol data collected in this way is stored in the database 360. In some cases, big data analysis based on the Hadoop 350 is attempted. Also, a structure is provided, in which web monitoring is performed using a PC 370 and a web 380.

There are a method utilizing a standard, a method utilizing an adaptor, and a method utilizing model conversion, which enable different types of protocols to be compatible with each other, as described above. The method utilizing a standard uses a single unified version and thus can be easily linked but is difficult to be applied to existing systems. Also, the method utilizing an adaptor is a method of making an adaptor and adding a system for processing the adaptor whenever a conversion protocol is generated. In this case, as the number of systems connected increases, the number of adaptors may increase exponentially.

The method utilizing model conversion is a method of making one model based on a meta-model and generating a heterogeneous model through the model. According to an embodiment of the present invention, a successful interoperation with existing heterogeneous systems may be performed using the method utilizing conversion.

Accordingly, in the present invention, an example of a method of integrating data with heterogeneous protocols based on the meta-model using model conversion will be described in detail.

Generally, the protocol data is classified into protocol data for transmission and protocol data for reception. Usually, when data is transmitted, the data is not interpreted, and an instruction is input without any change. However, when data is received, the data should be read and processed. Accordingly, the data should be read and parsed. The data protocol for transmission and the data protocol for reception are as follows.

EXAMPLE

Transmission: #1NQ110000$
Response:
1NR1100010004000A0029000000000000038
4000000000000$ It is difficult to understand all of the different types of protocols and individually write program code when the above task is written with programming code. Accordingly, the present invention promotes rapid development by performing a pre-process of modeling a heterogeneous protocol based a meta-model to automatically generate code for processing data of the modeled protocol without individually writing separate code.

In particular, when the protocol is modeled based on the meta-model, the modeling may be performed by inputting only desired information without having to understand a complicated heterogeneous protocol.

Figure 4:
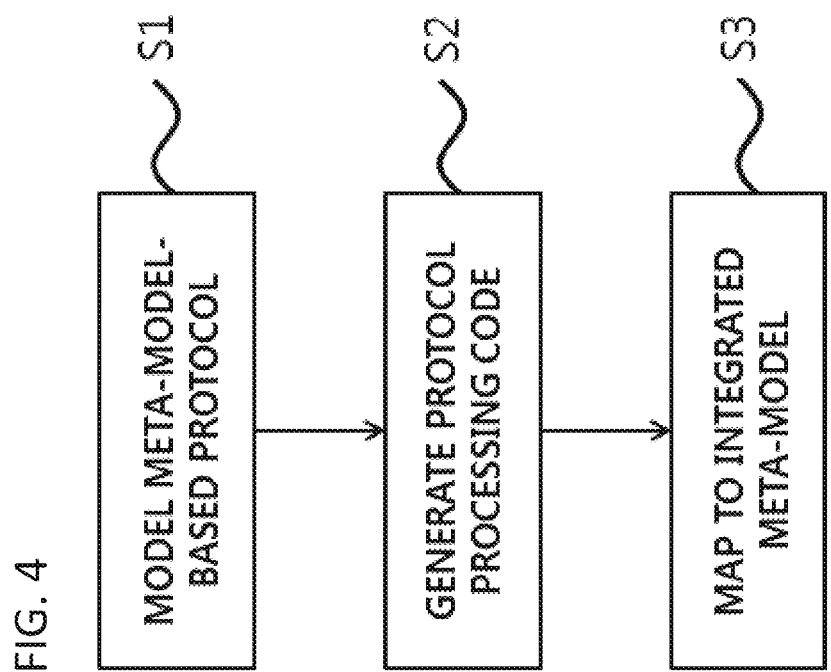
FIG. 4 is a flowchart of a method of monitoring photovoltaic power generation according to an embodiment of the present invention.

Referring to FIG. 4, in order to freely interoperate with a heterogeneous system, the present invention includes modeling a communication protocol between each of the photovoltaic power generation facilities 100-1, . . . , 100-N and the integrated server 200 on the basis of meta-model (S1), automatically generating program code capable of processing data of the modeled protocol (S2), and mapping the crated program code to an integrated meta-model of the integrated server 200 (S3).

The steps of the method of integrating heterogeneous communication protocols on the basis of a meta-model will be described below in detail with reference to FIGS. 4 to 8.

(1) Meta-Model-Based Protocol Modeling (S1)

As described above, the meta-model-based protocol modeling process (S1) is a pre-process for automatically performing code generation to be described below. In particular, the process S1 performs modeling on the basis of a meta-model, and a detailed description thereof is as follows.

Figure 5:
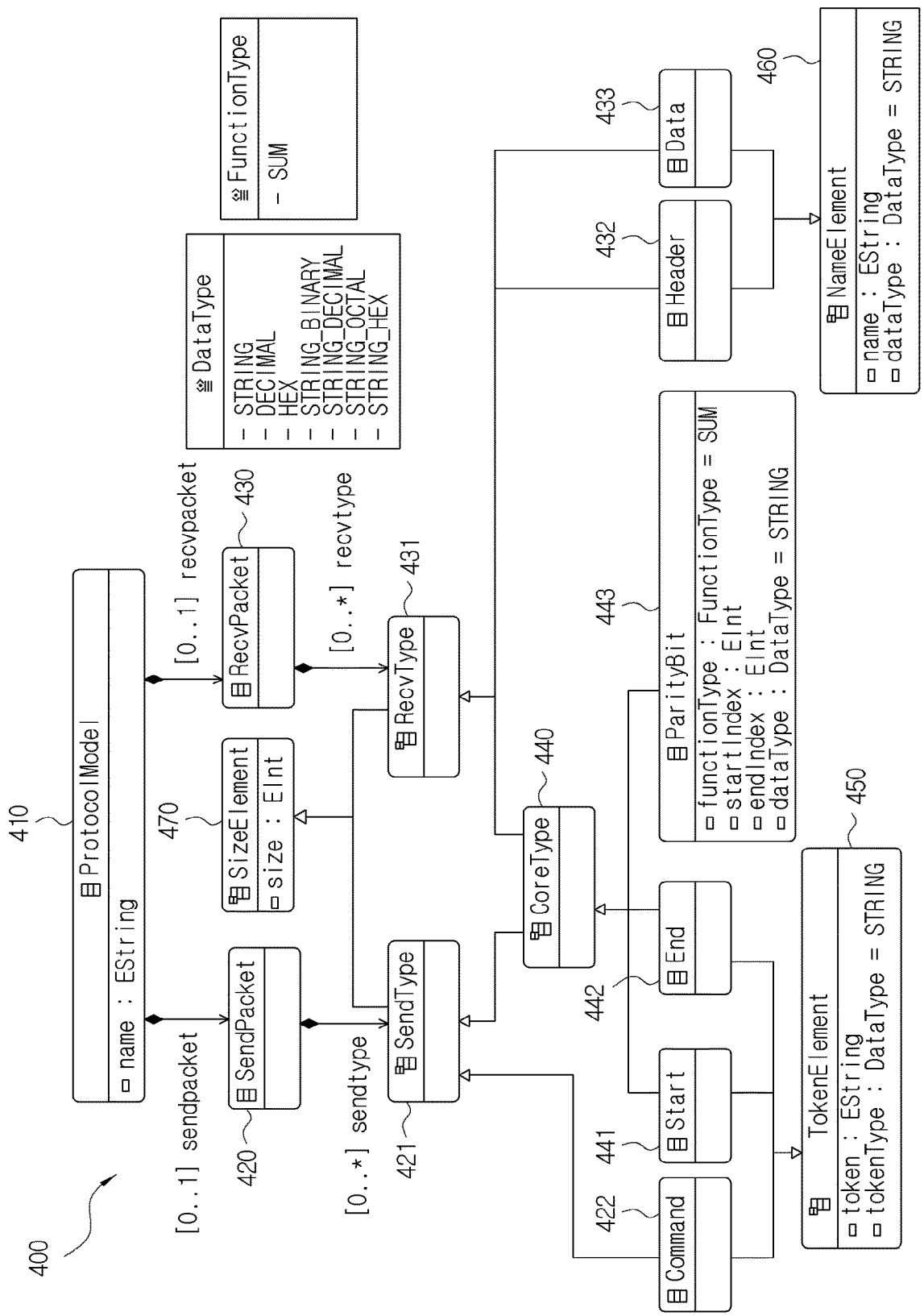
FIG. 5 is a diagram showing a meta-model of a meta-model-based protocol model according to an embodiment of the present invention.

The meta-model-based protocol modeling (S1) will be described in detail with reference to FIG. 5. FIG. 5 is a diagram showing a meta-model 400 of a meta-model-based protocol model.

ProtocolModel 410 is a root node and may receive model name information. Packet is a bundled unit defined in a protocol and is a unit of data that can be transmitted at one time. Therefore, there should be at least one Packet in the model.

The Packet may include several Types. The Types includes Start, Header, Command, Data, ParityBit, and End, each of which has size information. The size information is the size of data, which is expressed in bytes. For example, the size of 4 bytes is input as 4.

The meta-model 400 of the meta-model-based protocol model is classified into SendPacket 420 for transmission and RecvPacket 430 for reception. Each of the two kinds of Packets has Type. SendPacket 420 is classified into and included as SendType 421, and RecvPacket 430 is classified into and included as RecvType 431.

The two kinds of Types include CoreType 440. CoreType 440 has Start 441, End 442, and ParityBit 443, which are commonly used by SendType 421 and RecvType 431.

ParityBit 443 is used to determine whether data values have been transmitted without an error. A value obtained by adding of all data values to be transmitted is sent for the determination. When the value is equal to the sum of transmitted data values, a receiving side determines that the transmitted data has integrity.

SendType 421 has Command 422 in addition to CoreType 440. RecvType 431 includes Header 432 and Data 433 in addition to CoreType 440.

Header 432 and Data 433 may be used to input information of NameElement 460. NameElement 460 has a name and a data type. The data type is used to distinguish between a string and a number when data is actually parsed according to the type of data.

Command 422, Start 441, and End 442 may be used to input information of TokenElement 450. TokenElement 450 may have a unique character. For the token of protocol that starts from $ and ends to #, as an example, Start is $, and End is #. A token type is a value indicating the type of data in which a token should be represented and is used to distinguish between a character string and a number, as with the data type.

FIG. 9 shows notation that is used to form the meta-model-based protocol model. A data type needs to be written in a box and thus can be checked. "{1}" next to the name refers to the size of data and indicates 1 byte.

Figure 10:
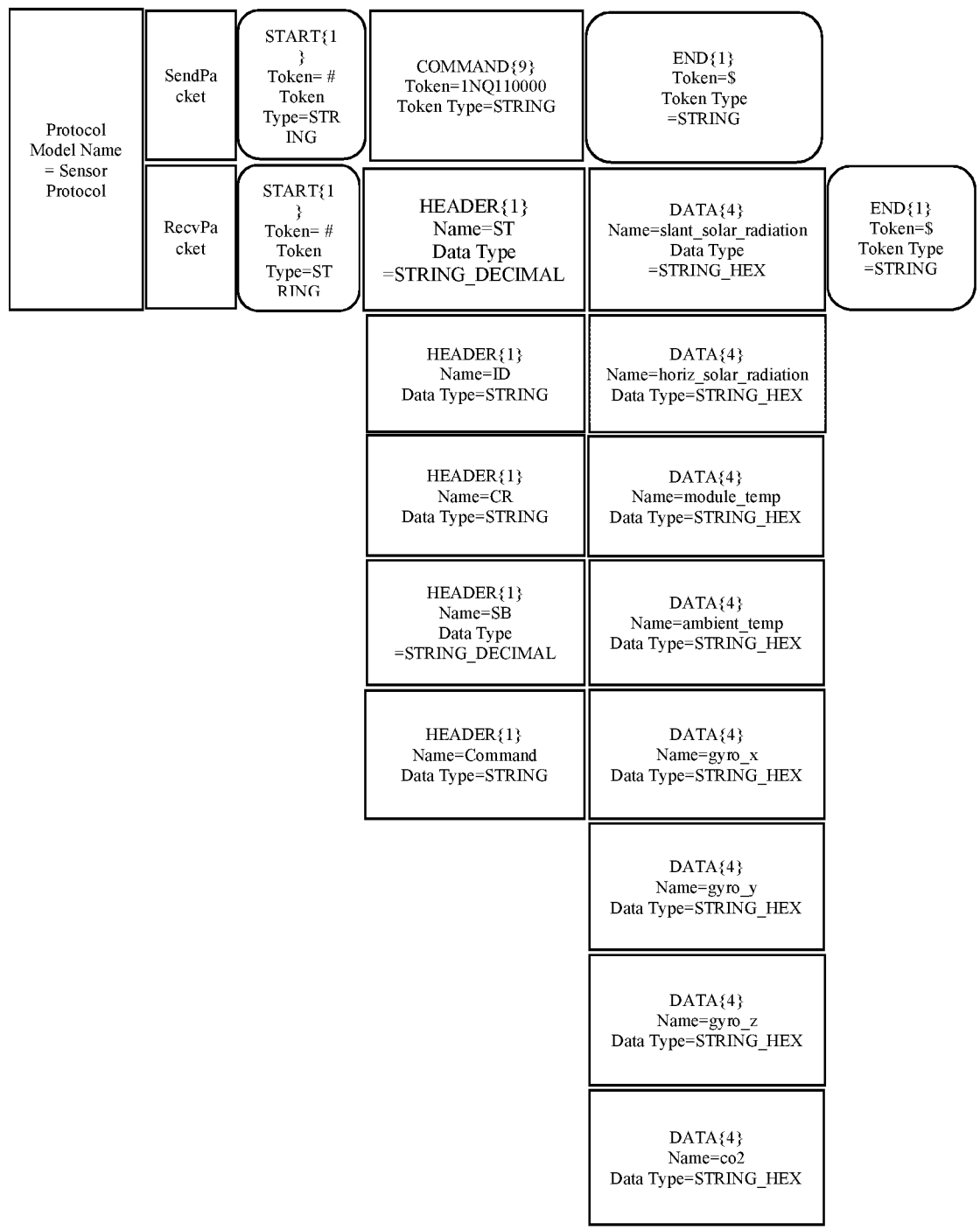
FIG. 10 is a table showing the model of data protocol example 1 using the meta-model 400 of the meta-model-based protocol model.

FIG. 10 shows modeling of the following data protocol example 1 using the meta-model 400 of the meta-model-based protocol model.

Example 1

Transmission: #1NQ110000$
Response: #1NR1100010004000A00290000000000000384000000000000

FIG. 11 shows a data storage format of the meta-model-based protocol modeling shown in FIG. 10. FIG. 11 represents a structure of a file in which the protocol of example 1 is stored.

In the meta-model-based protocol modeling of FIG. 10, all elements, except for ProtocolModel and the Packet, have their order. Accordingly, upon modeling, the order is required to be observed.

That is, when the meta-model-based protocol modeling is in order from left to right and has lower blocks, the meta-model-based protocol modeling performs all of the lower blocks and then moves to the first block at the right side. This can prevent the modeling from being too long when the modeling is arranged sequentially and laterally.

(2) Generation of Protocol Processing Code (S2)

Figure 6:
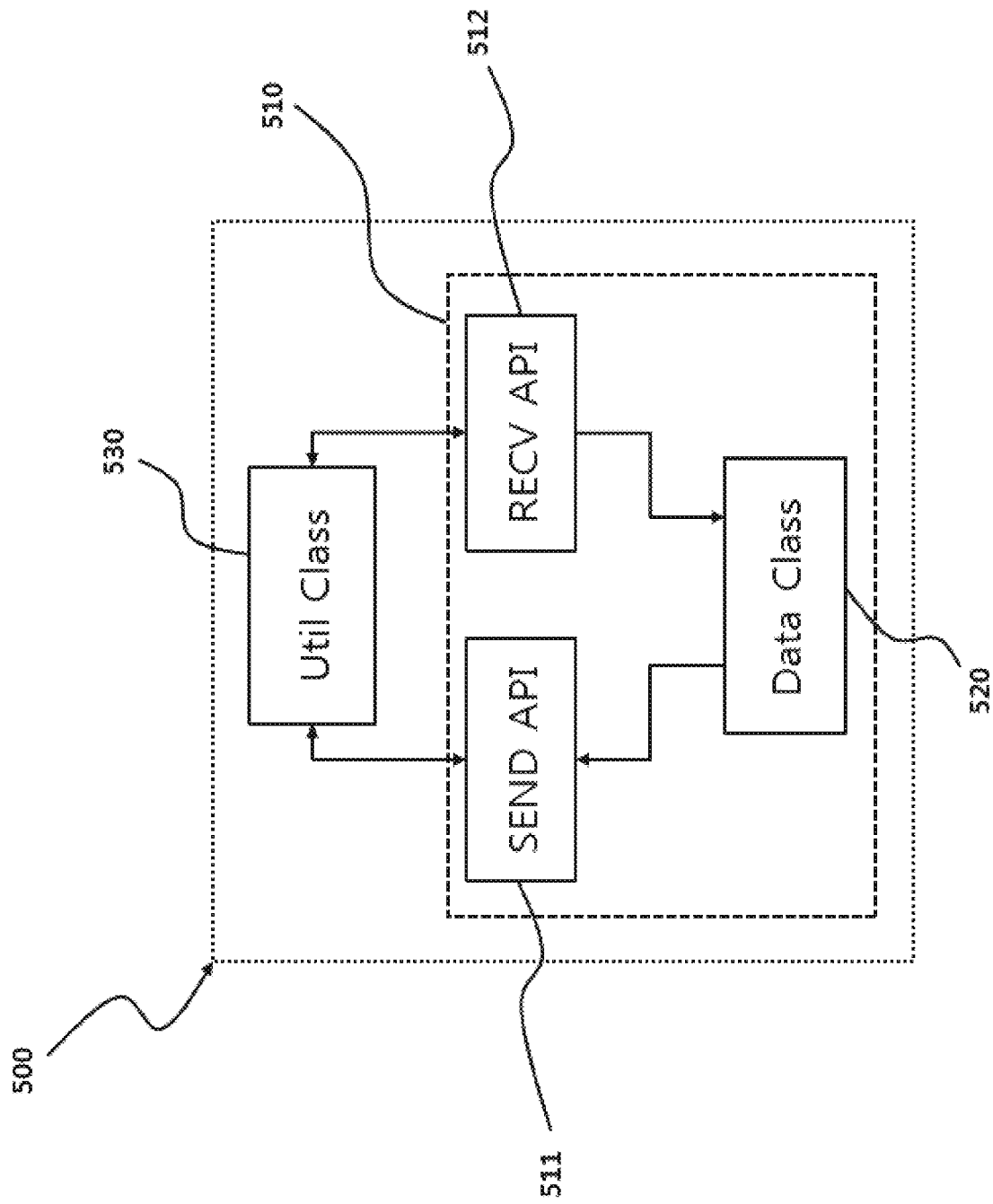
FIG. 6 is a diagram showing a structure of code that is generated through a meta-model-based protocol model according to an embodiment of the present invention.

A method of automatically generating program code(S2) for processing data of the meta-model-based protocol model formed in process S1 will be described in detail below with reference to FIG. 6. FIG. 6 is a diagram showing a structure of code that is generated through a meta-model-based protocol model.

The program code is automatically generated by inputting the modeled protocol into a code generation unit. The automatically generated program code is for a process of mapping to an integrated meta-model of the integrated server 200 to be described below and is used by the code generation unit to interpret any protocol.

As shown in FIG. 6, code 500 is generated in three classes. The first class is Send/Receive class 510 provided to process protocol transmitted or received. The second class is Data class 520 in which data generated in the protocol is stored. The third class is Util class 530 in which an application program interface (API) used for protocol interpretation is stored.

The Send/Receive class 510 includes Data class 520 for reading and processing data. When code is generated, the Send/Receive class 510 may be allowed to receive Data class 520.

Also, the Send/Receive class 510 has two APIs, that is, send API 511 and recv API 512. When data is sent, the send API 511 may receive byte data to be written for a serial port. The recv API 512 reads the received byte data and inputs the data into Data class 520.

According to such a configuration, operational mechanisms of the three classes formed in the generated code will be described in detail below, each along with an example.

First, the send API 511 is processed according to data input into the meta-model-based protocol model 410. For example, when there is an example of transmission of the meta-model-based protocol model shown in FIG. 12, automatic generation is performed as shown in FIG. 13.

Examining the details of the send API 511, since output is performed in the form of byte data, data is collected using ArrayList first, and finally the ArrayList is converted into a byte arrangement and then returned. The conversion is processed in Util class 530.

In FIG. 13, a SEND keyword, which is a keyword added to prevent a collision with data of the recv API 512, is attached to the front of the send API 511.

Figure 12:
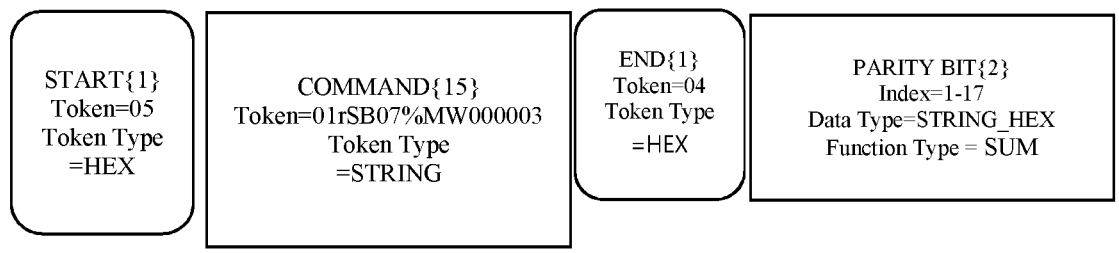
FIG. 12 is a table showing an example of transmission of the meta-model-based protocol model.

In order to transmit data in the send API 511, START is used at the beginning in the example of transmission of the meta-model-based protocol model of FIG. 12. START is brought from Data class 520 and input into the ArrayList. In this case, the input may be a string value or a byte value. However, since both of the two types can be processed in Util class 530, code is automatically generated in order of the model, as shown in FIG. 12, irrespective of the types. In addition, PARITY BIT written last in FIG. 12 can also be processed through the API of Util class 530.

Next, the recv API 512 sequentially reads and inputs received data. For example, when a model is defined as shown in FIG. 14, the recv API 512 generates code as shown in FIG. 15.

Figure 14:
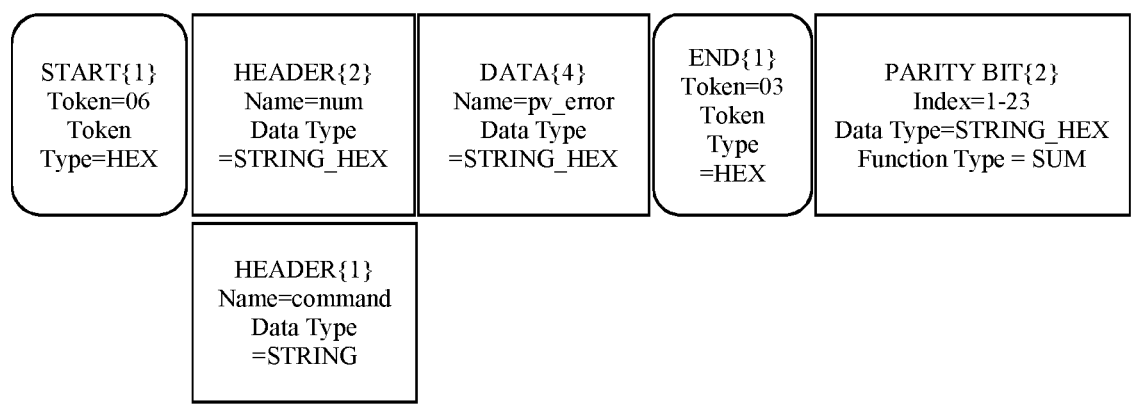
FIG. 14 is a table showing an example of reception of the meta-model-based protocol model.

In FIG. 14, the recv API 512 has index variable because the recv API 512 should sequentially read data. In FIG. 14 and FIG. 15, data having a token value, such as START and END, is used not for reading data but for checking error in input data. Accordingly, START and END may check that an input data value is false by bringing a data value and returning a false response when the data value is different from the input data value.

The data input of the recv API 512 is sequentially processed using a setter function of Data class 520, and the data processing is performed in Util class 530. Thus, without a separate processing, data is just input in the recv API 512.

Since code of the recv API 512 is sequentially executed, _index value varies depending on a size value 470 of the meta-model-based protocol model 400. Also, some data should be read and processed in units of two bytes rather than one byte. This is also processed by utilizing API that has already been made in Util class 530.

Next, Data class 520 forms data in the order in which input is made into the meta-model-based protocol model 400. In this case, string data is formed when the data type is STRING, and read-only data that is unchangeable is formed when the data type is Token. Also, in other cases, data is declared as int.

For example, in an example of reception of the meta-model-based protocol model shown in FIG. 14, Data class 520 is formed as shown in FIG. 16.

Util API is determined according to the type of data input to the modeled protocol. In this case, a conversion is performed as shown in FIG. 17, and also an API list that is used in Util class is shown in FIG. 18.

(3) Mapping to Integrated Meta-Model (S3)

Through the process of generating protocol processing code (S2), data may be collected in Data class 520 by using the code 500 that is generated through the meta-model-based protocol model 400. Accordingly, data generated in heterogeneous protocols can be simply collected by the integrated model.

Figure 7:
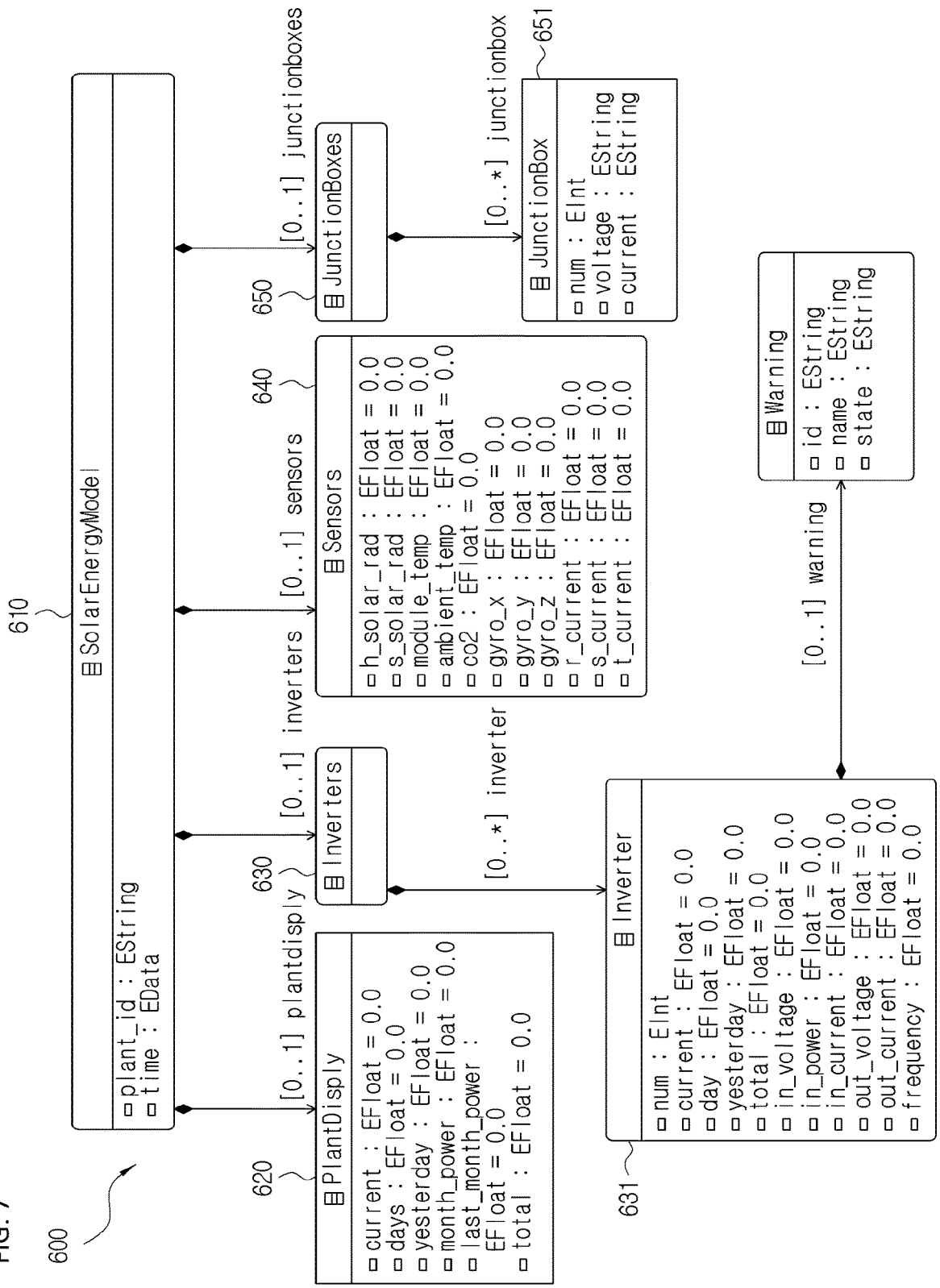
FIG. 7 is a diagram showing a meta-model of an integrated model according to an embodiment of the present invention.

By mapping the collected data to a meta-model of an integrated model (S3) shown in FIG. 7 and integrating data generated by different types of protocols in the plurality of local servers 120-1, . . . , 120-N, which are regionally distributed, it is possible to perform remote monitoring through the integrated server 200 even without changing the existing legacy system.

Referring to FIG. 7, it can be seen, from information included by the meta-model of the integrated model, that SolarEnergyModel 610 is a model at the top having an ID and a transmission time of a power station as attributes. The SolarEnergyModel 610 includes the element PlatDisplay 620, the element Inverters 630, the element Sensors 640, and the element JunctionBoxes 650.

The element PlatDisplay 620 sends a current output amount, current-day power generation information, previous-day power generation information, current-month power generation information, previous-month power generation information, and total power generation information. Also, the element Inverters 630 sends information that may be obtained by an element Inverter 631. The element Inverter 631 may obtain current power generation, current-day power generation, previous-day power generation, total power generation, output current and voltage, input power, current, voltage, and frequency, and inverter warning information.

Also, the element Sensors 640 sends horizontal solar radiation, tilted solar radiation, module temperature, external temperature, CO2 concentration, and slope. Also, the element JunctionBoxes 650 may obtain voltage, current, etc. of a solar cell module connected to the element JunctionBox 651.

Figure 8:
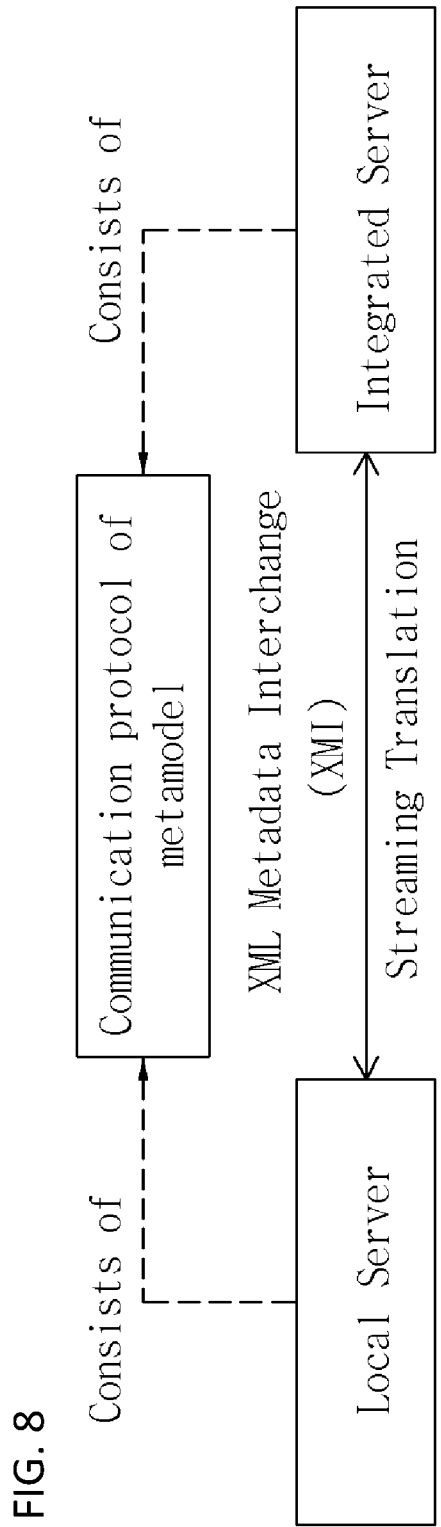
FIG. 8 is a diagram showing a meta-model-based protocol processing structure according to an embodiment of the present invention.

As described above, the integrated model that is implemented as the meta-model through the three steps shown in FIG. 4 needs a communication method. That is, the local servers 120-1, . . . , 120-N and the integrated server 200 may perform writing and transmission according to a meta-model rule of a communication protocol. This is shown in FIG. 8. That is, model data of the meta-model uses XMI, which is basically string data. Thus, the model data of the meta-model may be transmitted and received through TCP/IP.

The system and method for monitoring photovoltaic power generation according to the present invention enables data integration between monitoring systems that use different types of protocols based on the meta-model. Thus, there is no need to change the existing monitoring system that has been in use and establish a new monitoring system, thus enhancing utilization of unused monitoring systems and saving on budget.

Also, the system and method for monitoring photovoltaic power generation according to the present invention may manage power generation facilities at remote distances in an integrated manner, thus quickly handling problems that have occurred and monitoring yield and an activation status of the facilities in real time. Therefore, the system and method are useful for managing generation of power from new renewable energy generated by the facilities.

Although the present disclosure has been described with reference to specific embodiments and features, it will be appreciated that various variations and modifications can be made from the disclosure by those skilled in the art. For example, suitable results may be achieved if the described techniques are performed in a different order and/or if components in a described system, architecture, device, or circuit are combined in a different manner and/or replaced or supplemented by other components or their equivalents. Accordingly, other implementations, embodiments, and equivalents are within the scope of the following claims.

What is claimed is:

1. A method of monitoring photovoltaic power generation using a plurality of photovoltaic power generation facilities installed in a regionally distributed manner, each of which includes an additional facility and a power generation unit for generating power using a solar cell module, and an integrated server for managing the photovoltaic power generation facilities in an integrated manner, the method comprising generating an integrated communication protocol applied to all of the plurality of photovoltaic power generation facilities and the integrated server, wherein the generating of an integrated communication protocol comprises:

when power generation data for monitoring a power generation state of the power generation unit and additional facility data for monitoring a state of the additional facility, which is composed of a junction box, an inverter, and a sensor installed in the power generation unit, are provided to the integrated server through heterogeneous communication protocols that are individually used by the plurality of photovoltaic power generation facilities, individually modeling the heterogeneous communication protocols based on a meta-model;

automatically generating program code for interpreting the modeled heterogeneous communication protocols; and connectively mapping monitoring data collected by the photovoltaic power generation facilities to an element of an integrated meta-model designed in the integrated server by executing the generated program code, wherein:

the modeling operation comprises determining formats and an order of the heterogeneous communication protocols used by the photovoltaic power generation facilities, writing a type and a size of the monitoring data, modeling the heterogeneous communication protocols to block-shaped elements arranged in the order of the heterogeneous communication protocols, processing the monitoring data according to attributes of the modeled block-shaped elements, and storing the processed monitoring data in a local server of a corresponding photovoltaic power generation facility;

a default order of the modeled block-shaped elements for which the monitoring data is to be processed is from left to right, and when there are lower blocks, all of the lower blocks are processed, and then a first upper block at a right side is processed;

the generating operation comprises automatically generating the program code for interpreting the heterogeneous communication protocols according to a rule set in a util class and also the attributes of the block-shaped elements model in the modeling operation by a code generation unit stored in the util class and storing the generated program code in a data class;

the mapping operation comprises executing the program code generated in the generating operation to interpret the heterogeneous communication protocols, receiving the monitoring data collected by the photovoltaic power generation facilities from the integrated server through the interpreted heterogeneous communication protocols, storing the received monitoring data in the data class, and mapping the monitoring data stored in the data class to the element of the integrated metamodel of the integrated server using a getter function of the data class; and when the monitoring data is mapped using the getter function, the power generation data, sensor data, inverter data, and junction box data are mapped to an element PlatDisplay, an element Sensors, an element Inverters, and an element JunctionBoxes, respectively.

2. The method of claim 1, wherein:

the generating operation further comprises a send/receive class for sending or receiving the heterogeneous communication protocols;

the send/receive class includes a send API and a receive API;

the send API obtains, from the data class, byte data to be used for a serial port when a protocol is sent; and the receive API sequentially reads and input the obtained byte data into the data class when the protocol is received.

3. The method of claim 1, wherein the data class forms data in order of inputs made into the data protocol model.

4. The method of claim 1, wherein:

the util class includes a util API that is already made; and the util API is determined depending on data types of the heterogeneous communication protocols of the photovoltaic power generation facilities, which are input into the modeled heterogeneous communication protocols, and is utilized to interpret the heterogeneous communication protocols.

5. The method of claim 1, wherein:

the element PlatDisplay includes a current output amount, current-day power generation information, previous-day power generation information, current-month power generation information, previous-month power generation information, and total power generation information, which show an entire monitoring result;

the element Inverters includes current power generation, current-day power generation, previous-day power generation, total power generation, output current and voltage, input power, current, voltage, and frequency, and inverter warning information, which are obtainable by an inverter;

the element Sensors includes horizontal solar radiation, tilted solar radiation, module temperature, external temperature, $CO_2$ concentration, and slope, which are information measured by sensors of each of the photovoltaic power generation facilities; and the element JunctionBoxes used to obtain a voltage and current of the photovoltaic power generation facility.

* * * * *